United States Patent
Kim et al.

(10) Patent No.: US 8,154,934 B2
(45) Date of Patent: Apr. 10, 2012

(54) SEMICONDUCTOR MEMORY DEVICE AND MEMORY SYSTEM HAVING THE SAME

(75) Inventors: Ho-Young Kim, Incheon (KR); Ho-Cheol Lee, Yongin-si (KR); Jung-Bae Lee, Yongin-si (KR)

(73) Assignee: Samsung Electronics Co., Ltd., Yeongong-gu, Suwon-si, Gyeonggi-do (KR)

( * ) Notice: Subject to any disclaimer, the term of this patent is extended or adjusted under 35 U.S.C. 154(b) by 133 days.

(21) Appl. No.: 12/788,029

(22) Filed: May 26, 2010

(65) Prior Publication Data
US 2010/0322021 A1 Dec. 23, 2010

(30) Foreign Application Priority Data
Jun. 19, 2009 (KR) .................. 10-2009-0055208

(51) Int. Cl.
*G11C 7/00* (2006.01)
*G11C 8/18* (2006.01)
(52) U.S. Cl. .................... 365/193; 365/233.1
(58) Field of Classification Search .......... 365/193, 365/233.1
See application file for complete search history.

(56) References Cited

U.S. PATENT DOCUMENTS

| | | | |
|---|---|---|---|
| 5,844,858 A | 12/1998 | Kyung | |
| 6,081,477 A | 6/2000 | Li | |
| 6,091,663 A | 7/2000 | Kim et al. | |
| 6,292,410 B1 | 9/2001 | Yi et al. | |
| 6,396,768 B2* | 5/2002 | Ooishi | 365/193 |
| 6,894,945 B2 | 5/2005 | Sawada | |
| 6,909,643 B2 | 6/2005 | Kwean | |
| 6,940,321 B2 | 9/2005 | Heo et al. | |
| 7,180,800 B2 | 2/2007 | Kim | |
| 7,412,616 B2* | 8/2008 | Matsui et al. | 713/401 |
| 2003/0185088 A1* | 10/2003 | Kono | 365/233 |
| 2007/0014164 A1 | 1/2007 | Lee | |

FOREIGN PATENT DOCUMENTS

| | | |
|---|---|---|
| JP | 2003-007069 | 1/2003 |
| JP | 2003-059298 | 2/2003 |
| KR | 10-0164395 | 9/1998 |
| KR | 10-2003-0014568 | 2/2003 |
| KR | 10-0668854 | 1/2007 |

* cited by examiner

*Primary Examiner* — Anh Phung
(74) *Attorney, Agent, or Firm* — Muir Patent Consulting, PLLC

(57) ABSTRACT

A semiconductor memory device is disclosed. The semiconductor device includes a memory cell array, a clock signal generator configured to receive an external clock signal from the outside of the memory device and output an internal clock signal, and a data output unit configured to receive an internal data signal from the memory cell array and output a read data signal in response to the internal clock signal. The semiconductor memory device also includes a read data strobe unit configured to output a read data strobe signal having a cycle time of n times (n is an integer equal to or more than 2) a cycle time of the internal clock signal, based on the internal clock signal.

20 Claims, 8 Drawing Sheets

SEMICONDUCTOR MEMORY DEVICE AND MEMORY SYSTEM HAVING THE SAME

PRIORITY STATEMENT

This application claims the benefit of priority under 35 U.S.C. §119 from Korean Patent Application No. 10-2009-0055208, filed on Jun. 19, 2009, the disclosure of which is hereby incorporated herein by reference in its entirety.

BACKGROUND

The disclosed embodiments relate to a semiconductor memory device, and more particularly, to a single data rate (SDR) semiconductor memory device and a memory system having the same in which power consumption is reduced by making a cycle time of a data strobe signal larger than a cycle time of a clock signal.

Generally, a single data rate (SDR) semiconductor memory device outputs data in synchronization with a rising edge of a clock signal. The SDR semiconductor memory device needs a data strobe signal in order to minimize a skew between a plurality of input/output data signals.

The data strobe signal is toggled in synchronization with the clock signal, and as a cycle time of the data strobe signal is reduced, power consumption is increased. Accordingly, a larger cycle time of the data strobe signal than a cycle time of the clock signal is desirable.

SUMMARY

In one embodiment, a semiconductor memory device is disclosed. The power consumption of the memory device may be reduced by making a cycle time of a data strobe signal larger than a cycle time of a clock signal.

In another embodiment, a memory system is disclosed. The memory system may have a semiconductor memory device in which power consumption is reduced by making a cycle time of the data strobe signal larger than a cycle time of the clock signal.

In another embodiment, semiconductor memory device is disclosed. The semiconductor device includes a memory cell array, a clock signal generator configured to receive an external clock signal from the outside of the memory device and output an internal clock signal, and a data output unit configured to receive an internal data signal from the memory cell array and output a read data signal in response to the internal clock signal. The semiconductor memory device also includes a read data strobe unit configured to output a read data strobe signal having a cycle time of n times (n is an integer equal to or more than 2) a cycle time of the internal clock signal, based on the internal clock signal.

In a further embodiment, a memory system is disclosed. The memory system includes a semiconductor memory device and a memory controller. The semiconductor memory device comprises a memory cell array configured to output stored data as an internal read data signal, a clock signal input buffer configured to receive a clock signal and output an internal clock signal, and a data and read data strobe signal output unit configured to receive the internal read data signal and the internal clock signal, and to output a read data strobe signal having a cycle time of n times (n is an integer equal to or more than 2) a cycle time of the internal clock signal, and an output read data signal. The memory controller is configured to output the clock signal and receive the output read data signal in response to the read data strobe signal in a read operation.

In another embodiment, another memory system is disclosed. The memory system includes a memory device and a memory controller. The memory device includes a memory cell array that outputs a read data signal, and a read data strobe output unit that generates a read data strobe signal based on a clock signal and outputs the read data strobe signal outside the memory device. The memory controller is configured to output the clock signal to the memory device and receive the read data strobe signal and the read data signal. In one embodiment, the read data strobe signal has a cycle time of n (n is an integer equal to or more than 2) times a cycle time of the clock signal in a read operation.

BRIEF DESCRIPTION OF THE DRAWINGS

Example embodiments are described in further detail below with reference to the accompanying drawings. It should be understood that various aspects of the drawings may have been exaggerated for clarity. The use of similar or identical reference numbers in the various drawings is intended to indicate the presence of a similar or identical element or feature.

DETAILED DESCRIPTION OF THE EMBODIMENTS

Figure 1:
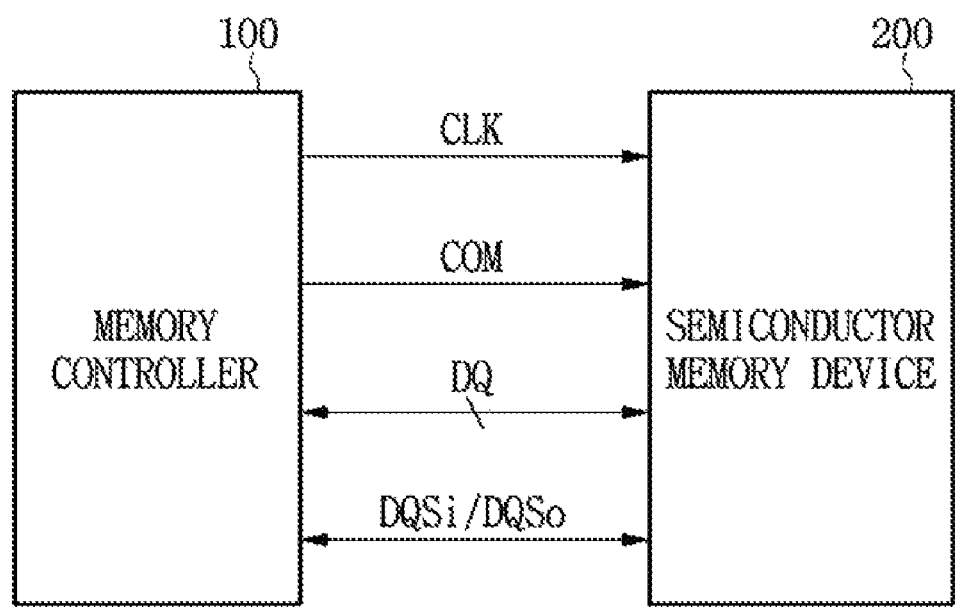
FIG. 1 illustrates a configuration of a semiconductor memory system having a semiconductor memory device according to one embodiment.

Example embodiments will now be described more fully with reference to the accompanying drawings in which some example embodiments are shown. In the drawings, the relative sizes of elements and regions may be exaggerated for clarity. Detailed illustrative embodiments are disclosed herein. However, specific structural and functional details disclosed herein are merely representative for purposes of describing example embodiments. This inventive concept, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concept.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two steps or figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the inventive concept is not limited to example embodiments described.

FIG. 1 illustrates a configuration of a memory system having a semiconductor memory device according to one embodiment. The memory system of FIG. 1 may include a memory controller 100 and a semiconductor memory device 200.

Functions of the components illustrated in FIG. 1 will be described below.

The memory controller 100 outputs a command COM and a clock signal CLK, receives a plurality of data signals DQ output from the semiconductor memory device 200 in response to a read data strobe signal DQSO output from the semiconductor memory device 200 in a read operation. In a write operation, the memory controller 100 outputs a write data strobe signal DQSi and a plurality of data signals DQ which are to be synchronized with the write data strobe signal DQSi. The write data strobe signal DQSi may have a cycle time the same as or n times (n may be an integer equal to or more than 2) that of a cycle time of the clock signal CLK. For example, the memory controller 100 may be configured to receive the data signal DQ in response to rising and falling edges (dual edge) of the read data strobe signal DQSo in the read operation and output the data signal DQ which is to be synchronized with a dual edge of the write data strobe signal DQSi in the write operation. The command COM may include a read command output in the read operation and a write command output in the write operation.

The semiconductor memory device 200 performs the read/write operation in response to the clock signal CLK and the command COM. The semiconductor memory device 200 may be configured to receive the data signals DQ in response to the write command and the write data strobe signal DQSi in the case of performing the write operation and output the data signals DQ which are synchronized with the rising or falling edge (single edge) of the clock signal and the read data strobe signal DQSo having a cycle time of n times (n may be an integer equal to or more than 2) a cycle time of the clock signal CLK in response to the read command in the case of performing the read operation. The semiconductor memory device 200 may synchronize the read data strobe signal DQSo with the clock signal CLK in the read operation.

Figure 2:
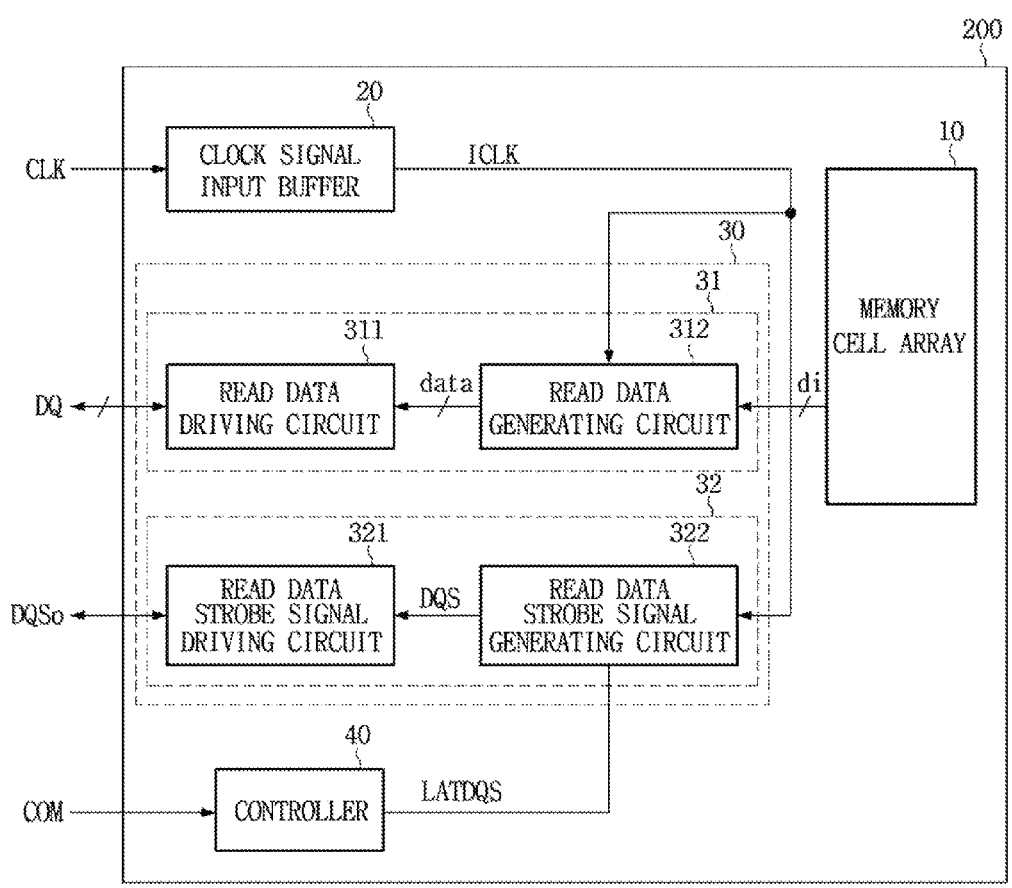
FIG. 2 illustrates a configuration of a portion of a semiconductor memory device which relates to a read operation according to another embodiment.

FIG. 2 illustrates a configuration of a portion of the semiconductor memory device 200 of FIG. 1 which relates to the read operation. The semiconductor memory device 200 may be configured to include a memory cell array 10, a clock signal input buffer 20, a data and read data strobe output unit 30, and a controller 40. The data and read data strobe output unit 30 may be configured to include a data output unit 31 and a read data strobe output unit 32. The data output unit 31 may be configured to include a read data driving circuit 311 and a read data generating circuit 312. The read data strobe output unit 32 may be configured to include a read data strobe signal driving circuit 321 and a read data strobe signal generating circuit 322.

Functions of the components illustrated in FIG. 2 will be described below.

The memory cell array 10 outputs stored data as an internal data signal di in the read operation. The clock signal input buffer 20 receives a clock signal CLK output from the memory controller 100 and outputs an internal clock signal ICLK. The signal CLK may be referred to as an external clock signal, since it is received from a device external to semiconductor memory device 200. Further, the clock signal input buffer 20 may include PLL or DLL circuit. As such, in one embodiment, the signal ICLK may have the same phase and cycle time as the signal CLK.

In the read operation, the data and read data strobe signal output unit 30 receives the internal clock signal ICLK and the internal data signal di, and outputs the data signal DQ (referred to as a read data signal DQ or output read data signal DQ for the read operation) and the read data strobe signal DQSo having a cycle time of n times (n may be an integer equal to or more than 2) a cycle time of the clock signal CLK.

The data output unit 31 receives an internal data signal di, also referred to as an internal read data signal di, output from the memory cell array 10 and the internal clock signal ICLK, and outputs the data signal DQ, which is synchronized with ICLK (i.e., the cycle period of ICLK has a fixed temporal relationship to the smallest potential data period of the data signal DQ, for example, so that the edges of the periods align or the middle of the period for the data signal DQ aligns with the edges of ICLK). For example, the read data generating circuit 312 of the data output unit 31 receives the internal data signal di output from the memory cell array 10, and generates an internal output signal, synchronizing the internal output signal with an edge (e.g., one of a rising or falling edge) of the internal clock signal ICLK. The read data driving circuit 311 of the data output unit 31 drives the internal output signal to output the data signal DQ, which may include the same data as the internal data signal di and internal output signal. The numbers of the internal data signal di, the internal output signal, and the data signal DQ may be plural.

The read data strobe output unit 32 receives the internal clock signal ICLK and outputs the read data strobe signal DQSo having a cycle time of n times a cycle time of the clock signal CLK. The read data strobe output unit 32 may be configured to output the read data strobe signal DQSo in response to the read command input signal from the memory controller 100. Further, the read data strobe output unit 32 may be configured to synchronize the read data strobe signal DQSo with the clock signal CLK (e.g., align edges of the DQSo signal with certain edges of the CLK signal) in the read operation. The read data strobe signal generating circuit 322 of the read data strobe output unit 32 receives the internal clock signal ICLK and outputs a data strobe signal DQS having a cycle time of n times the cycle time of the clock signal CLK. The read data strobe signal driving circuit 321 drives the data strobe signal DQS and outputs the read data strobe signal DQSo. The read data strobe signal generating circuit 322 may be configured to output the data strobe signal DQS in response to the read command input signal from the memory controller 100.

The controller 40 may be configured to output a data strobe latency signal LATDQS which is activated during a predetermined time in response to a read command COM input from the outside in the read operation.

That is, the semiconductor memory device 200 may be configured to include the controller 40 such that during a read operation, the read data strobe output unit 32 outputs the read data strobe signal DQSo based on the data strobe latency signal LATDQS output from the controller 40 in the read operation (for example, DQSo will not be output for a predetermined latency time period). Therefore, the semiconductor memory device 200 may be configured to generate the read data strobe signal DQSo in response to the read command. Alternatively, the read data strobe output unit 32 of the semiconductor memory device 200 may be configured to output the read data strobe signal DQSo in response to the read command directly input from the memory controller 100 (e.g., the control signal LATDQS or an equivalent signal could be sent from controller 100 to read data strobe output unit 32). In this case, the controller 40 may be omitted.

Figure 3:
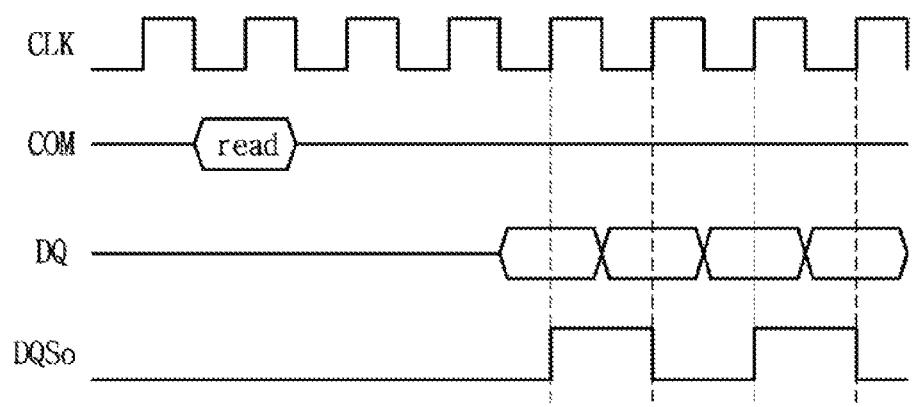
FIG. 3 is an exemplary operation timing diagram for explaining the read operation of the semiconductor memory device of FIG. 2.

FIG. 3 is an exemplary operation timing diagram for explaining the read operation of the semiconductor memory device of FIG. 2. FIG. 3 illustrates a case in which the read data strobe output unit 32 outputs the read data strobe signal DQSo having a cycle time of twice the cycle time of the clock signal CLK. In FIG. 3, CLK denotes the clock signal input from the memory controller 100, COM denotes the command input from the controller 100, DQ denotes the data signal output from the data output unit 31, and DQSo denotes the read data strobe signal output from the read data strobe output unit 32.

The read operation of the semiconductor memory device 200 of FIG. 2 will be described below with reference to FIG. 3.

In the read operation, the data signal DQ output from the semiconductor memory device 200 is synchronized with the rising edge of the clock signal CLK input from the memory controller 100 and outputted through the data output unit 31. For example, the output data signal DQ may be aligned with the clock signal CLK so that a center of a data of the data signal DQ is positioned at the rising edge of the clock signal CLK. That is, the semiconductor memory device 200 may be a single data rate (SDR) semiconductor memory device.

Further, in the read operation, the read data strobe signal DQSo output from the semiconductor memory device 200 may be generated by the read data strobe output unit 32, be synchronized with the clock signal CLK (e.g., such that each edge of strobe signal DQSo aligns with a rising edge of clock signal CLK), and have a cycle time of twice the cycle time of the clock signal CLK.

As such, the memory controller 100 receives the read data signal DQ in response to the rising edge and the falling edge (dual edge) of the read data strobe signal DQSo in the read operation.

Figure 4:
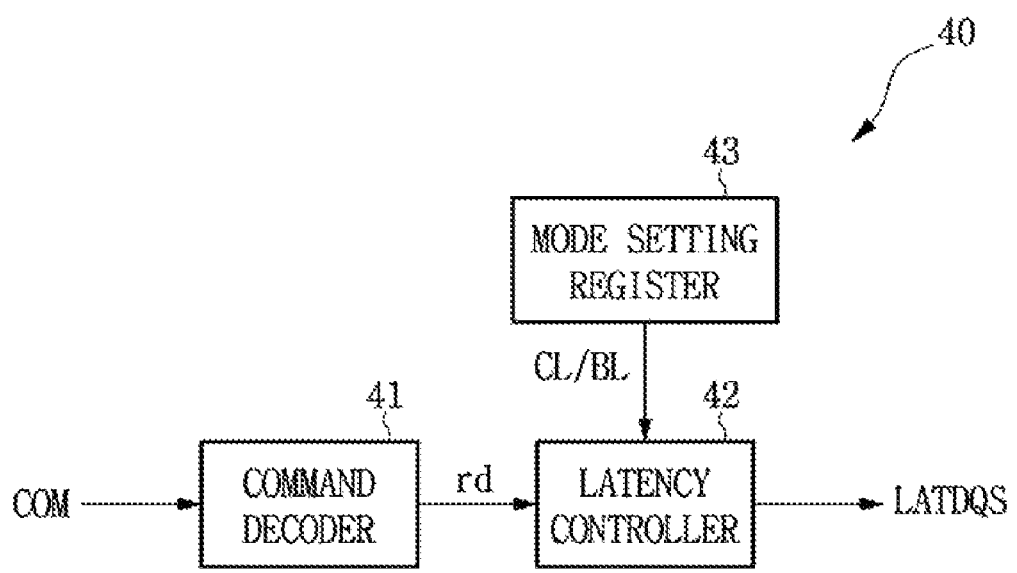
FIG. 4 illustrates an exemplary configuration of a controller of the semiconductor memory device of FIG. 2.

FIG. 4 illustrates an exemplary configuration of the controller 40 of the semiconductor memory device 200 illustrated in FIG. 2. The controller 40 may be configured to include a command decoder 41, a latency controller 42, and a mode setting register 43.

Functions of the components of FIG. 4 will be described below.

The command decoder 41 generates a read command signal rd in response to a read command input from the memory controller 100 in the read operation.

The mode setting register 43 outputs signals indicating a read latency CL and a burst length BL in the read operation. Although not shown, the mode setting register 43 may be configured to receive an address signal input from the memory controller 100, set the read latency CL and the burst length BL, and output indicators of the set read latency CL and the set burst length BL, in response to a mode setting command output from the command decoder 41 in a mode setting operation.

The latency controller 42 outputs the data strobe latency signal LATDQS which is activated during a predetermined time in response to the read command signal rd. The latency controller 412 may be configured to activate the data strobe latency signal LATDQS after a predetermined time elapses according to the read latency CL in response to the read command rd, maintain the data strobe latency signal LATDQS in the activated state according to the burst length BL during a predetermined time, and thereafter inactivate the data strobe latency signal LATDQS.

Figure 5:
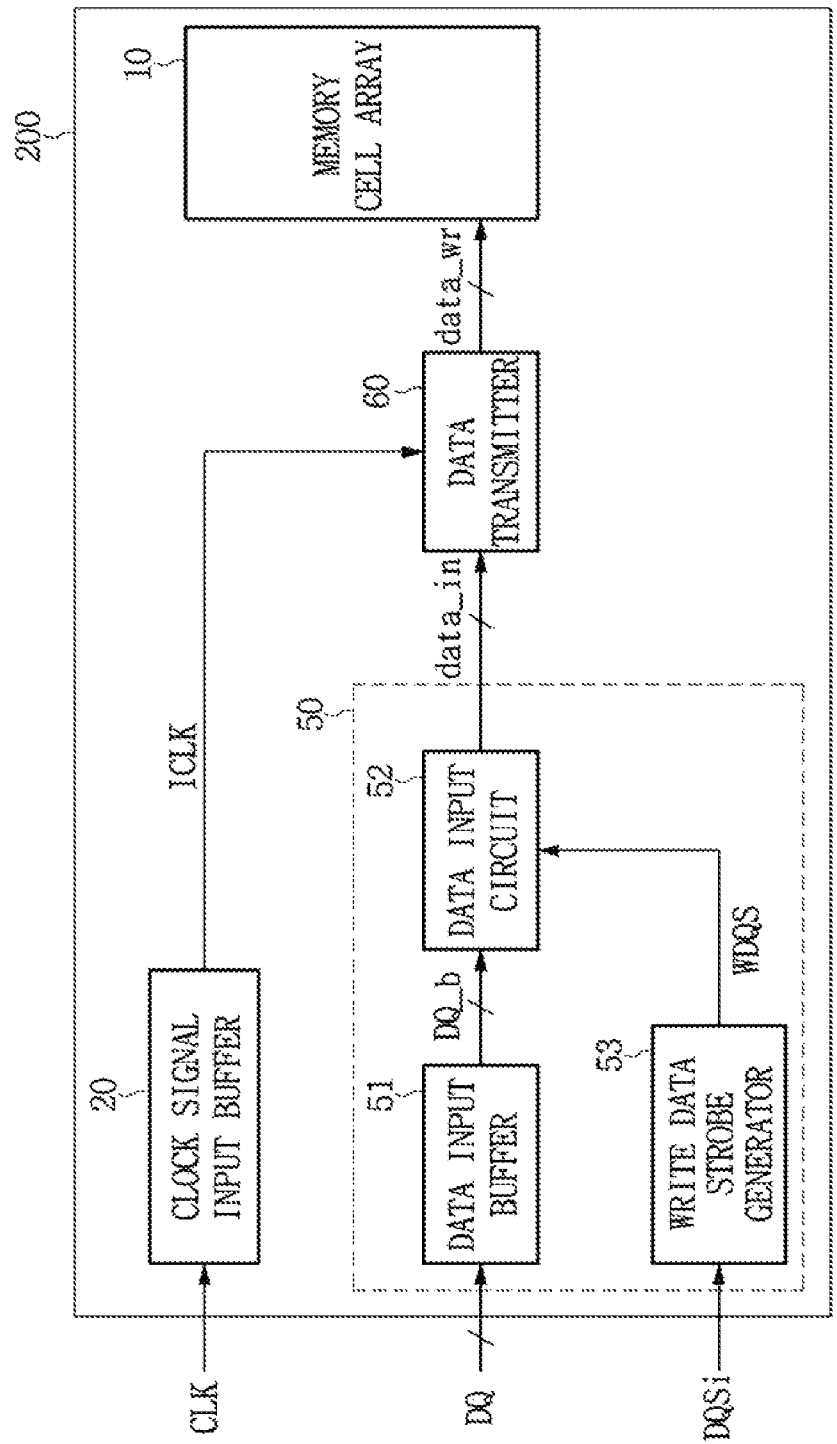
FIG. 5 illustrates a configuration of a portion of the semiconductor memory device which relates to a write operation according to another embodiment.

FIG. 5 illustrates a configuration of a portion of the semiconductor memory device 200 which relates to the write operation. The semiconductor memory device 200 may be configured to include a memory cell array 10, a clock signal input buffer 20, a data input unit 50, and a data transmitter 60. The data input unit 50 may be configured to include a data input buffer 51, a data input circuit 52, and a write data strobe generator 53.

Functions of the components illustrated in FIG. 5 will be described below.

The memory cell array 10 receives and stores write data data_wr in the write operation. The clock signal input buffer 20 receives the external clock signal CLK (e.g., output from the memory controller 100), and outputs an internal clock signal ICLK.

In the write operation, the data input unit 50 receives the external data signal DQ output from the memory controller 100 and outputs an internal input data signal data_in in response to the write data strobe signal DQSi output from the memory controller 100. The write data strobe signal DQSi output from the memory controller 100 may have either the same cycle time or a cycle time of n times (n may be an integer equal to or more than 2) the cycle time of the clock signal CLK. The memory controller 100 outputs the write data strobe signal DQSi and the data signal DQ which is synchronized with the write data strobe signal DQSi in the write operation.

The data input buffer 51 receives the external data signal DQ input from the memory controller 100 and outputs a buffered data signal DQ_b, which may be the same signal as external data signal DQ, but slightly delayed. The write data strobe input generator 53 receives the write data strobe signal DQSi input from the memory controller 100 and outputs an internal write data strobe signal WDQS. The data input circuit 52 receives the buffered data signal DQ_b and outputs the internal input data signal data_in in response to the internal write data strobe signal WDQS. That is, the data input circuit 52 outputs the internal input data signal data_in in response to the internal write data strobe signal WDQS so that data_in is synchronized with the internal write data strobe signal WDQS.

For example, the data input circuit 52 of the data input unit 50 may be configured to receive the buffered data signal DQ_b and to output the internal input data signal data_in in response to the rising edge and the falling edge (dual edge) of the internal write data strobe signal WDQS. Therefore, the internal input data signal data_in output from the data input unit 50 is synchronized with the internal write data strobe signal WDQS.

Figure 6:
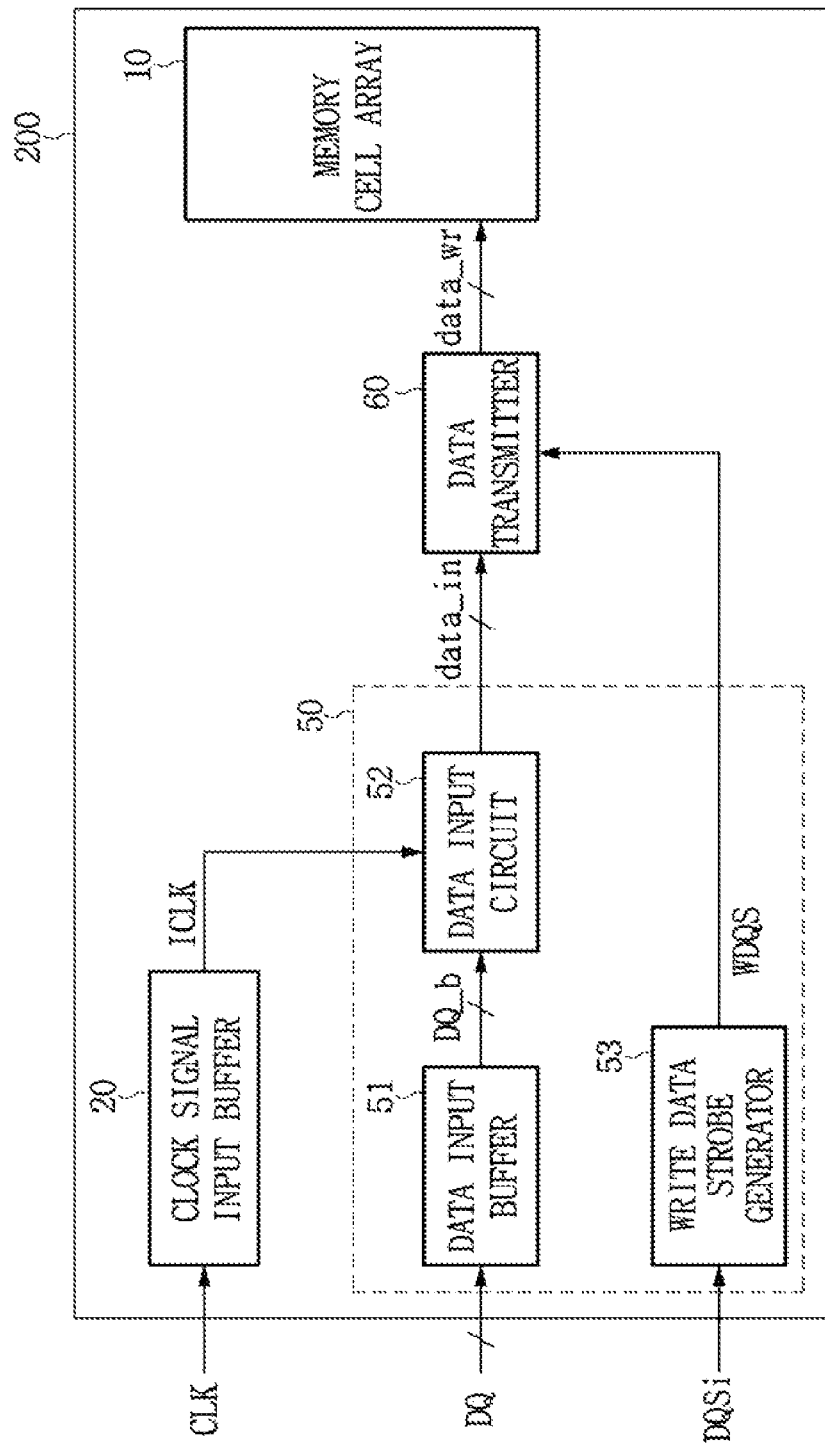
FIG. 6 illustrates a configuration of a portion of the semiconductor memory device which relates to a write operation according to another embodiment.

Alternatively, as shown in FIG. 6, the data input circuit 52 of the data input unit 50 may be configured to output the internal input data signal data_in in response to the only the rising or falling edge (e.g., single edge) of the internal clock signal ICLK, instead of outputting data_in in response to the internal write data strobe signal WDQS. That is, the internal input data signal data_in is synchronized with the internal clock signal ICLK.

Also, the data input unit 50 may be configured to include only the data input buffer 51 and the data input circuit 52 without the write data strobe generator 53.

The data transmitter 60 receives the internal input data signal data_in and the internal write data strobe signal WDQS, and as a result, outputs write data signal data_wr and synchronizes the write data strobe signal WDQS with the write data signal data_wr. Write data signal data_wr may then be input to memory cell array 10. The synchronization may be accomplished based on rising and falling edges of the WDQS signal, or based only on one of the rising or falling edges.

Figure 7:
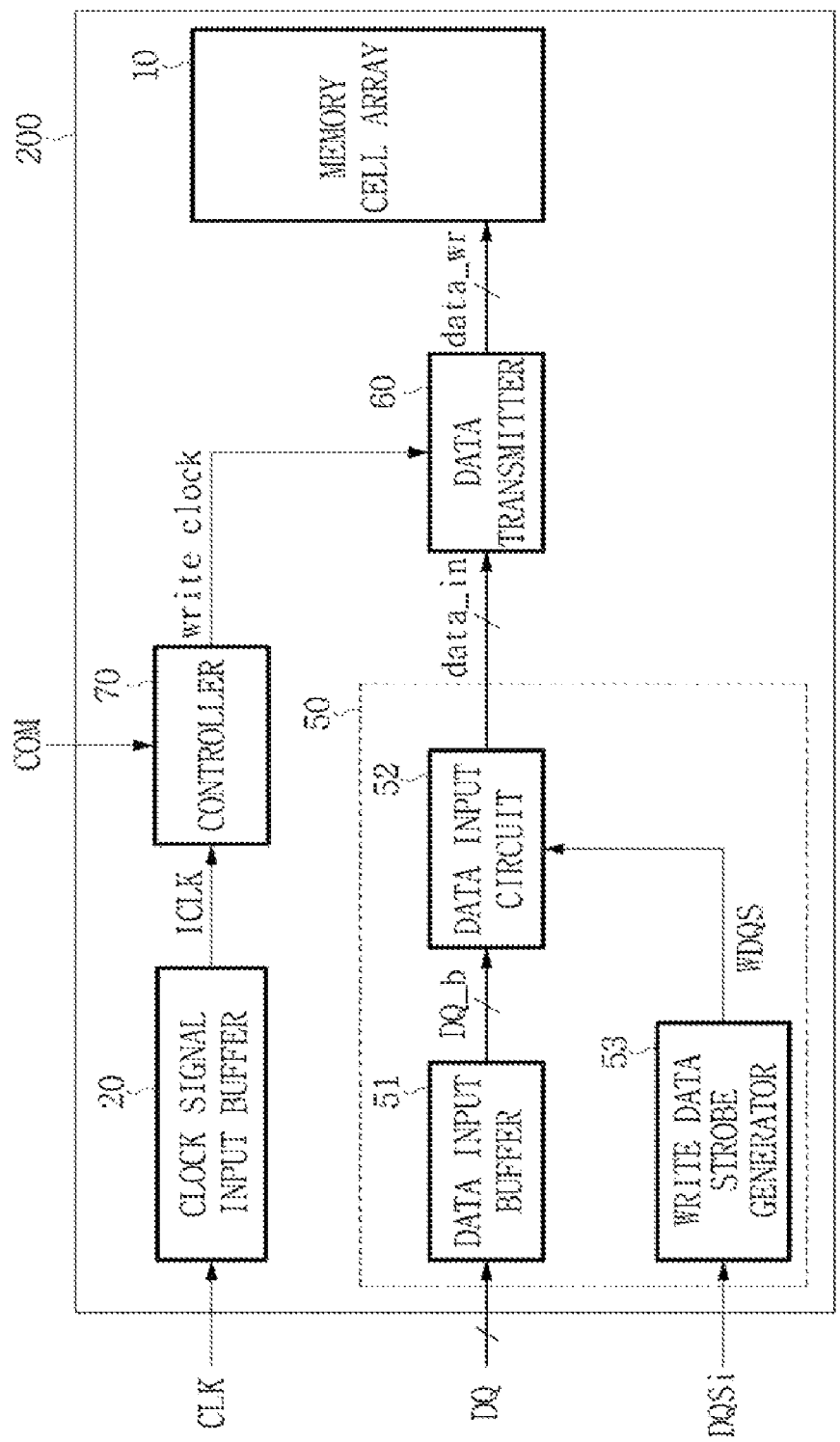
FIG. 7 illustrates a configuration of a portion of the semiconductor memory device which relates to a write operation according to another embodiment.

FIG. 7 is another exemplary configuration of a portion of the semiconductor memory device 200. The semiconductor memory device 200 may further include a controller 70 which receives the internal clock signal ICLK output by the clock signal input buffer 20 and outputs a write clock signal having the same cycle time as the internal clock signal ICLK in response to the command COM (that is, the write command) input from the memory controller 100 in the write operation. As such, the write clock signal functions as a second internal clock signal that is effectively the same as the internal clock signal ICLK, and either the clock signal input buffer 20 or a combination of the clock signal input buffer and controller 70 could be referred to as a clock signal generator. Semiconductor memory device 200 can be configured so that the data transmitter 60 receives the internal input data signal data_in and outputs the write data signal data_wr in response to the write clock signal output from the controller 70.

In this case, the controller 70 may be configured to include a command decoder which decodes the write command input COM input from the controller 100 and outputs the write command signal and a write clock generator which receives the internal clock signal ICLK and outputs the write clock signal having the same cycle time as the internal clock signal ICLK in response to the write command signal.

Furthermore, the write clock generator may be configured to output the write clock signal in response to a write latency and the burst length output from a mode setting register. The mode setting register may be configured to receive an address signal input from the memory controller 100, set the write latency and the burst length, and output the set write latency and the set burst length, in response to the mode setting command output from the command decoder in the mode setting operation.

Figure 8:
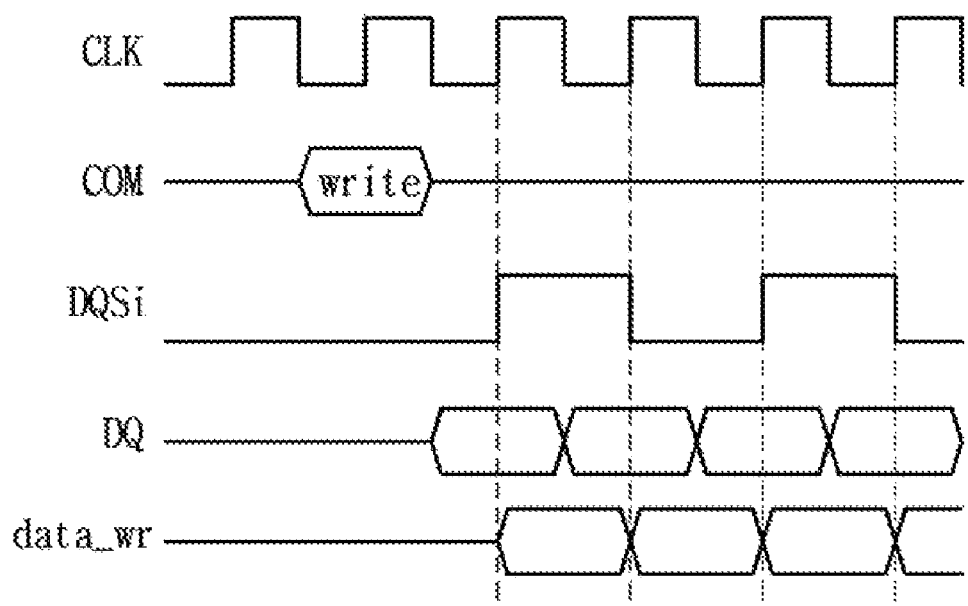
FIG. 8 is an exemplary operation timing diagram for explaining the write operation of the semiconductor memory device of FIG. 5.

FIG. 8 is an exemplary operation timing diagram for explaining the write operation of the semiconductor memory device 200 illustrated in FIG. 5. In FIG. 8, CLK denotes the clock signal input from the memory controller 100 (e.g., an external clock signal), DQSi denotes the write data strobe signal input from the controller 100, DQ denotes a data signal input from the controller 100, and data_wr denotes the write data signal input into the memory cell array 10.

In the write operation, the memory controller 100 outputs the clock signal CLK, the write data strobe signal DQSi having the cycle time of twice the cycle time of the clock signal CLK, and the data signal DQ to be synchronized with the write data strobe signal DQSi. Alternatively, the write data strobe signal may have the same cycle time as the clock signal CLK. In this case, a write data strobe generator generates an internal write data strobe signal having the cycle time of twice the cycle time of the clock signal CLK.

In the write operation, the semiconductor memory device 200 receives the data signal DQ and the write data strobe signal DQSi. In one embodiment, the semiconductor memory device 200 receives the data signal and generates the input data signal data_in synchronized with the internal write data strobe signal WDQS in response to a rising edge and a falling edge (dual edge) of the write data strobe signal DQSi. When the clock signal CLK is synchronized with the write data strobe signal DQSi, the input data signal data_in is also synchronized with the write data signal data_wr. For example, in one embodiment, the write data signal data_wr is generated in response to the rising or falling edge of the internal clock signal ICLK. That is, the write data signal data_wr is synchronized with the clock signal ICLK.

As illustrated in FIG. 8, the write data strobe signal DQSi input to the semiconductor memory device 200 may have the cycle time of twice the cycle time of the clock signal CLK. The write data strobe signal DQSi may be synchronized with the clock signal CLK by, for example, a write operation.

That is, the semiconductor memory device according to an example embodiment can reduce power consumption by generating the read data strobe signal having the cycle time of n times (n may be an integer equal to or more than 2) the cycle time of the clock signal in the read operation. Further, the semiconductor memory device according to an example embodiment can reduce power consumption by receiving data in response to the write data strobe signal having the cycle time of n times (n may be an integer equal to or more than 2) the cycle time of the clock signal even in the write operation.

As described above, a semiconductor memory device according to an example embodiment can reduce power consumption by making a cycle time of a data strobe signal larger than a cycle time of a clock signal.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
a memory cell array;
a clock signal generator configured to receive an external clock signal from the outside of the memory device and output an internal clock signal;
a data output unit configured to receive an internal data signal from the memory cell array and output a read data signal in response to the internal clock signal; and
a read data strobe unit configured to output a read data strobe signal having a cycle time of n times (n is an integer equal to or more than 2) a cycle time of the internal clock signal, based on the internal clock signal.

2. The semiconductor memory device of claim 1, wherein the read data signal is synchronized with a dual edge of the read data strobe signal.

3. The semiconductor memory device of claim 1, wherein the read data strobe unit outputs the read data strobe signal in response to a read command signal.

4. The semiconductor memory device of claim 1, further comprising:
a data input unit configured to receive a data signal and a write data strobe signal having a cycle time of n times the cycle time of the internal clock signal, the data signal and write data strobe signal being input from outside of the semiconductor device, and to output an internal input data signal in response to the write data strobe signal; and
a data transmitter configured to receive the internal input data signal and output a write data signal in response to the internal clock signal in a write operation.

5. The semiconductor memory device of claim 4, wherein the data signal is synchronized with a single edge of the internal clock signal and a dual edge of the write data strobe signal.

6. The semiconductor memory device of claim 1, further comprising:
a write data strobe signal generator configured to receive a write data strobe signal and output an internal write data strobe signal having a cycle time of n times a cycle time of the internal clock signal;
a data input unit configured to receive a data signal from outside the semiconductor memory device and output an internal input data signal in response to the internal clock signal; and
a data transmitter configured to receive the internal input data signal and output a write data signal in response to the internal write data strobe signal.

7. The semiconductor memory device of claim 6, wherein the write data signal is synchronized with a single edge of the internal clock signal and a dual edge of the internal write strobe signal.

8. A memory system, comprising:
a semiconductor memory device comprising:
a memory cell array configured to output stored data as an internal read data signal;
a clock signal input buffer configured to receive a clock signal and output an internal clock signal, and
a data and read data strobe signal output unit configured to receive the internal read data signal and the internal clock signal, and to output a read data strobe signal having a cycle time of n times (n is an integer equal to or more than 2) a cycle time of the internal clock signal, and an output read data signal; and
a memory controller configured to output the clock signal and receive the output read data signal in response to the read data strobe signal in a read operation.

9. The memory system of claim 8, wherein the data and read data strobe signal output unit comprises:
a data output unit configured to synchronize the output read data signal with a rising or falling edge of the internal clock signal and output the output read data signal; and
a read data strobe output unit configured to receive the internal clock signal and generate the read data strobe signal having a cycle time of n times the cycle time of the internal clock signal in the read operation.

10. The memory system of claim 9, wherein the memory controller outputs a read command in the read operation, and the read data strobe output unit outputs the read data strobe signal in response to the read command.

11. The memory system of claim 8, wherein the output read data signal is synchronized with a single edge of the clock signal and dual edge of the read data strobe signal.

12. The memory system of claim 8, wherein the memory controller outputs the clock signal, a write data strobe signal having a cycle time of n times the cycle time of the clock signal, and a data signal synchronized with the write data strobe signal in a write operation.

13. The memory system of claim 8, wherein the semiconductor memory device further includes:
a write data strobe signal generator configured to receive a write data strobe signal and output an internal write data strobe signal having a cycle time of n times a cycle time of the clock signal;
a data input unit configured to receive the data signal and output an internal input data signal in response to the internal write data strobe signal; and
a data transmitter configured to receive the internal input data signal and output a write data signal in response to the internal clock signal in a write operation.

14. The memory system of claim 13, wherein the write data signal is synchronized with a single edge of the clock signal and dual edge of the write data strobe signal in the write operation.

15. The memory system of claim 8, wherein the semiconductor memory device memory device further includes:
a write data strobe signal generator configured to receive a write data strobe signal and output an internal write data strobe signal having a cycle time of n times a cycle time of the clock signal;
a data input unit configured to receive a data signal and output an internal input data signal in response to the internal clock signal; and
a data transmitter configured to receive the internal input data signal and output a write data signal in response to the internal write data strobe signal in a write operation.

16. The memory system of claim 15, wherein the write data signal is synchronized with a single edge of the internal clock signal and dual edge of the internal write data strobe signal in the write operation.

17. A memory system, comprising:
a memory device including:
a memory cell array that outputs a read data signal, and
a read data strobe output unit that generates a read data strobe signal based on a clock signal and outputs the read data strobe signal outside the memory device; and a memory controller configured to output the clock signal to the memory device and receive the read data strobe signal and the read data signal, wherein the read data strobe signal has a cycle time of n (n is an integer equal to or more than 2) times a cycle time of the clock signal in a read operation.

18. The memory system of claim 17, wherein the read data signal is synchronized with a single edge of the clock signal and dual edge of the read data strobe signal in the read operation.

19. The memory system of claim 17, wherein:

the memory device is configured to receive a write data signal into the memory cell array in response to the clock signal and a write data strobe signal; and the memory controller is configured to output the clock signal, the write data strobe signal, and a data signal on which the write data signal is based to the memory device, wherein the write data strobe signal has a cycle time of n (n is an integer equal to or more than 2) times the clock signal in a write operation.

20. The memory system of claim 17, further wherein:

the memory device is configured to receive a write data signal into the memory cell array in response to the clock signal and a write data strobe signal; and the memory controller is configured to output the clock signal, the write data strobe signal, and a data signal on which the write data signal is based to the memory device, wherein the write data strobe signal has a same cycle time as the clock signal in a write operation.

* * * * *